United States Patent
Chen et al.

(10) Patent No.: US 10,861,885 B1
(45) Date of Patent: Dec. 8, 2020

(54) METHOD OF OBTAINING IMAGE DATA AND RELATED IMAGE SENSING SYSTEM

(71) Applicant: NOVATEK Microelectronics Corp., Hsin-Chu (TW)

(72) Inventors: Chi-Ting Chen, Hsinchu (TW); Shao-Yang Chiang, Hsinchu (TW)

(73) Assignee: NOVATEK Microelectronics Corp., Hsin-Chu (TW)

( * ) Notice: Subject to any disclaimer, the term of this patent is extended or adjusted under 35 U.S.C. 154(b) by 0 days.

(21) Appl. No.: 16/423,150

(22) Filed: May 27, 2019

(51) Int. Cl.
*H01L 27/146* (2006.01)
*H04N 5/235* (2006.01)
*H04N 5/341* (2011.01)
*H04N 5/3745* (2011.01)

(52) U.S. Cl.
CPC ..... *H01L 27/14603* (2013.01); *H04N 5/2351* (2013.01); *H04N 5/341* (2013.01); *H04N 5/37455* (2013.01)

(58) Field of Classification Search
CPC ............ H01L 27/14603; H04N 5/2351; H04N 5/37455; H04N 5/341
See application file for complete search history.

(56) References Cited

U.S. PATENT DOCUMENTS

| 2004/0228508 A1* | 11/2004 | Shigeta | .............. G06K 9/00026 382/124 |
| 2012/0314124 A1* | 12/2012 | Kaizu | .................. H04N 5/2355 348/362 |

* cited by examiner

*Primary Examiner* — Ahmed A Berhan
(74) *Attorney, Agent, or Firm* — Winston Hsu

(57) ABSTRACT

The present invention provides a method of obtaining image data for an image sensing system. The image sensing system includes a sensing area having a plurality of sensing pixels. The method includes the steps of: scanning at least two groups of sensing pixels among the plurality of sensing pixels with at least two integration times, respectively, to obtain a plurality of sensing results; obtaining a selected integration time from one of the at least two integration times according to the plurality of sensing results; and scanning the plurality of sensing pixels except for the at least two groups of sensing pixels with the selected integration time, to obtain the image data.

30 Claims, 10 Drawing Sheets

METHOD OF OBTAINING IMAGE DATA AND RELATED IMAGE SENSING SYSTEM

BACKGROUND OF THE INVENTION

1. Field of the Invention

The present invention relates to a method of obtaining image data and a related image sensing system, and more particularly, to a method of obtaining image data capable of reducing the time length required for determining the integration time of the image sensing system.

2. Description of the Prior Art

With advancements in technology, mobile devices such as smart phones, tablets, laptops, GPS navigation systems and electronic books have become indispensable in our daily life. Compared with conventional mobile phones that only have communication functions, modern mobile devices combine various functions such as communication, networking, photographing, games and data processing. This type of multifunctional design is more attractive to consumers. Fingerprint recognition is a popular function for security and privacy in various electronic devices, including mobile devices, and can be implemented in different techniques such as capacitance sensing, optical (image sensing), thermal, ultrasonic, etc. For example, a mobile phone may have a fingerprint recognition interface built into a home button or in a dedicated region to detect user fingerprint.

In recent years, the optical fingerprint recognition has become one of the most popular fingerprint recognition schemes. Like a general camera, the optical fingerprint sensor needs to find out a proper integration time (also called exposure time) for each received fingerprint image, to be adapted to various ambient light conditions. In order to achieve better user experiences on the fingerprint recognition applications, the electronic device such as the mobile phone is usually requested to determine whether the fingerprint image is correct within an extremely short time; hence, the optical fingerprint sensor has to determine the proper integration time quickly and accurately. In such a situation, the conventional auto exposure method, which obtains the proper integration time after scanning several image frames, may not be feasible.

Thus, there is a need to provide a novel method of obtaining the fingerprint image, so as to increase the speed of determining the integration time.

SUMMARY OF THE INVENTION

It is therefore an objective of the present invention to provide a method of obtaining image data and a related image sensing system, which are capable of increasing the speed of determining the integration time.

An embodiment of the present invention discloses a method of obtaining image data for an image sensing system. The image sensing system comprises a sensing area having a plurality of sensing pixels. The method comprises the steps of: scanning at least two groups of sensing pixels among the plurality of sensing pixels with at least two integration times, respectively, to obtain a plurality of sensing results; obtaining a selected integration time from one of the at least two integration times according to the plurality of sensing results; and scanning the plurality of sensing pixels except for the at least two groups of sensing pixels with the selected integration time, to obtain the image data.

Another embodiment of the present invention discloses an image sensing system, which comprises a sensing area and a sensor. The sensing area comprises a plurality of sensing pixels. The sensor, coupled to the sensing area, is configured to obtain image data by performing the following steps: scanning at least two groups of sensing pixels among the plurality of sensing pixels with at least two integration times, respectively, to obtain a plurality of sensing results; obtaining a selected integration time from one of the at least two integration times according to the plurality of sensing results; and scanning the plurality of sensing pixels except for the at least two groups of sensing pixels with the selected integration time, to obtain the image data.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
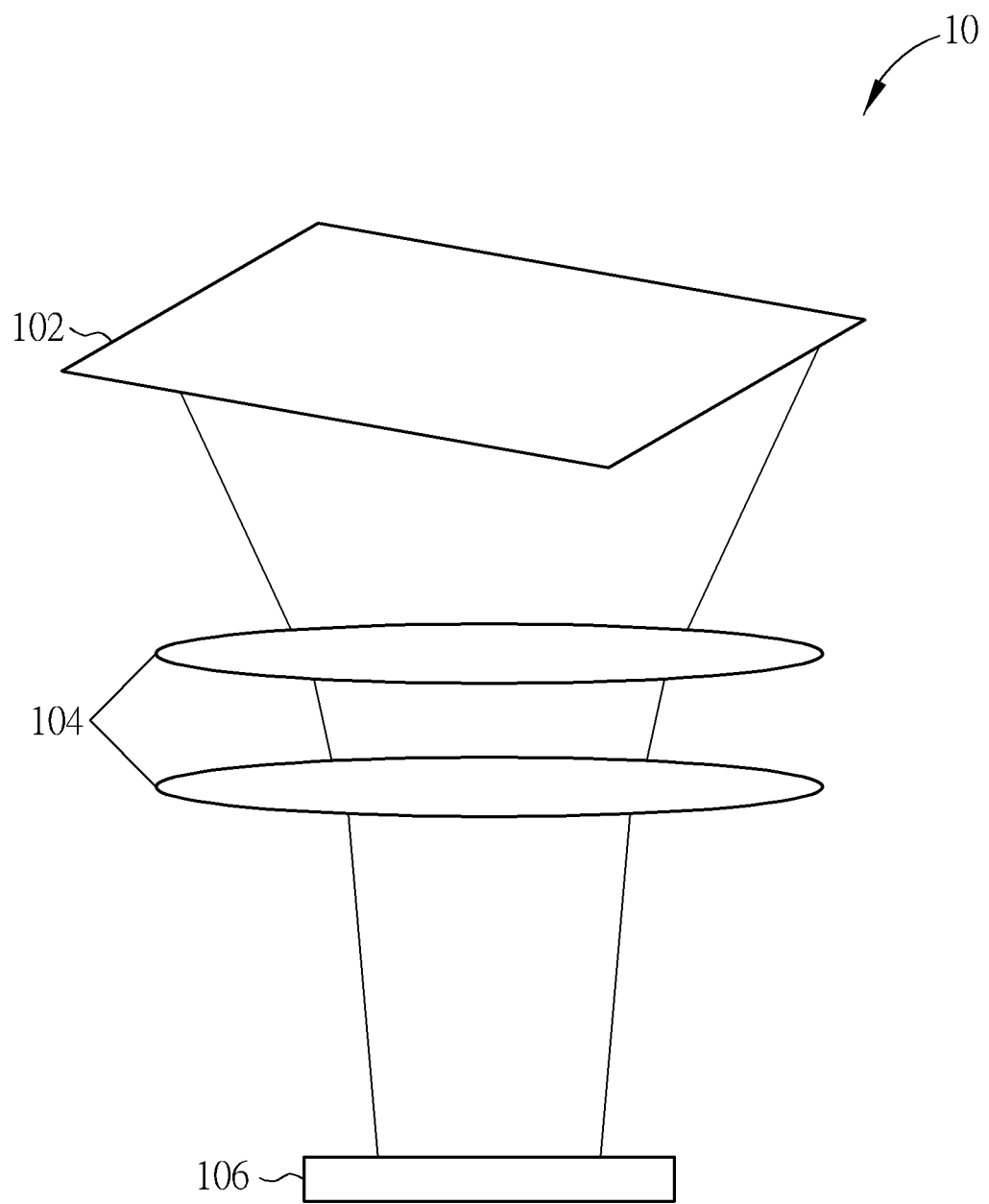
FIG. 1 is a schematic diagram of the structure of an optical fingerprint recognition system.

Please refer to FIG. 1, which is a schematic diagram of the structure of an optical fingerprint recognition system 10. The optical fingerprint recognition system 10 includes a touch panel 102, at least one lens 104 and a sensor integrated circuit (IC) 106. The touch panel 102 is configured to contact the finger of a user to receive the fingerprint image. The image is then forwarded to the sensor IC 106 via the lens 104. In some examples, the lens 104 may be cooperated with or replaced by a waveguide device. The sensor IC 106 may be a CMOS image sensor (CIS), where the fingerprint image is received by a sensing area of the CIS. The sensing area includes a great number of light sensing elements such as photodiodes, which are capable of receiving light and converting light into electrons. The electrons may be outputted in the form of any electronic signals such as voltages or currents and then be converted into digital image data by an analog to digital converter (ADC). Therefore, the digital image data can be processed by a processor or host device to construct the fingerprint image.

Figure 2:
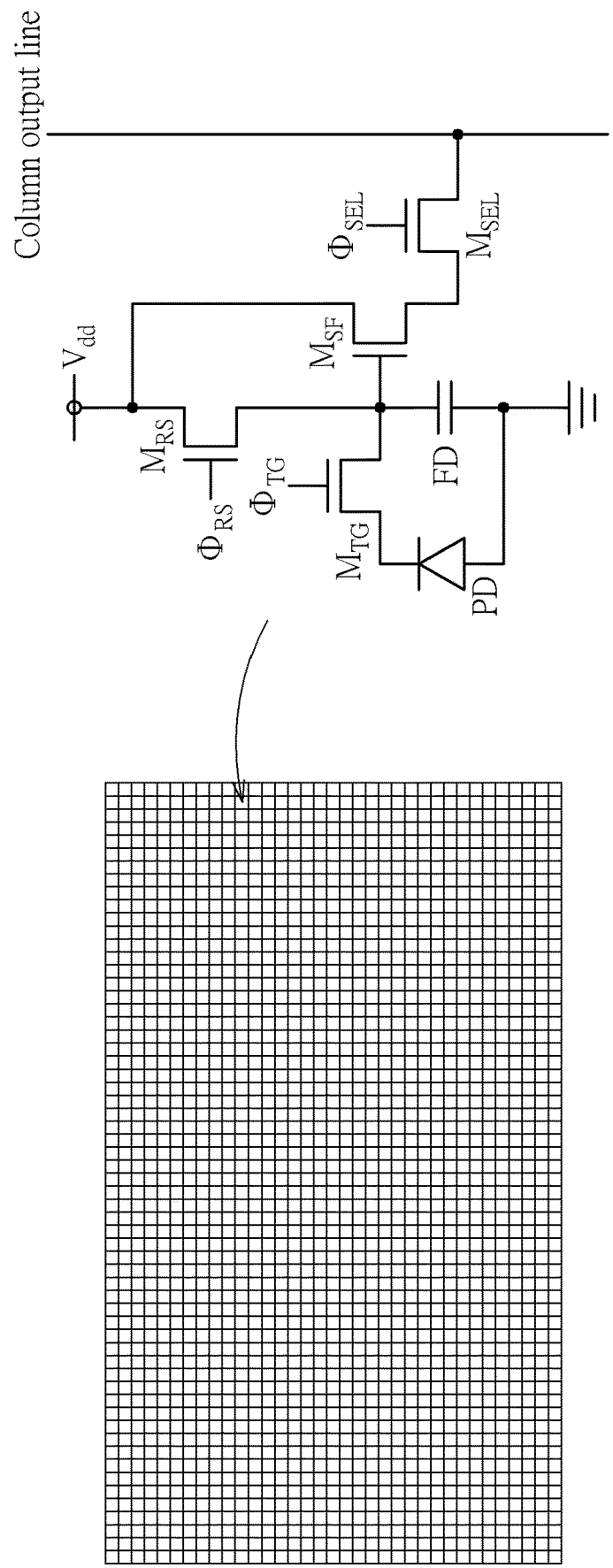
FIG. 2 is a schematic diagram of a sensing pixel array and related circuit structure.

More specifically, the sensing area may include a plurality of sensing pixels implemented as an array. Please refer to FIG. 2, which is a schematic diagram of a sensing pixel array and related circuit structure. As shown in FIG. 2, each sensing pixel includes a photodiode PD and a control circuit. In this example, the control circuit has a 4T active pixel sensor (APS) structure, which includes 4 transistors $M_{RS}$, $M_{TG}$, $M_{SF}$ and $M_{SEL}$, and 1 storage capacitor FD.

Figure 3:
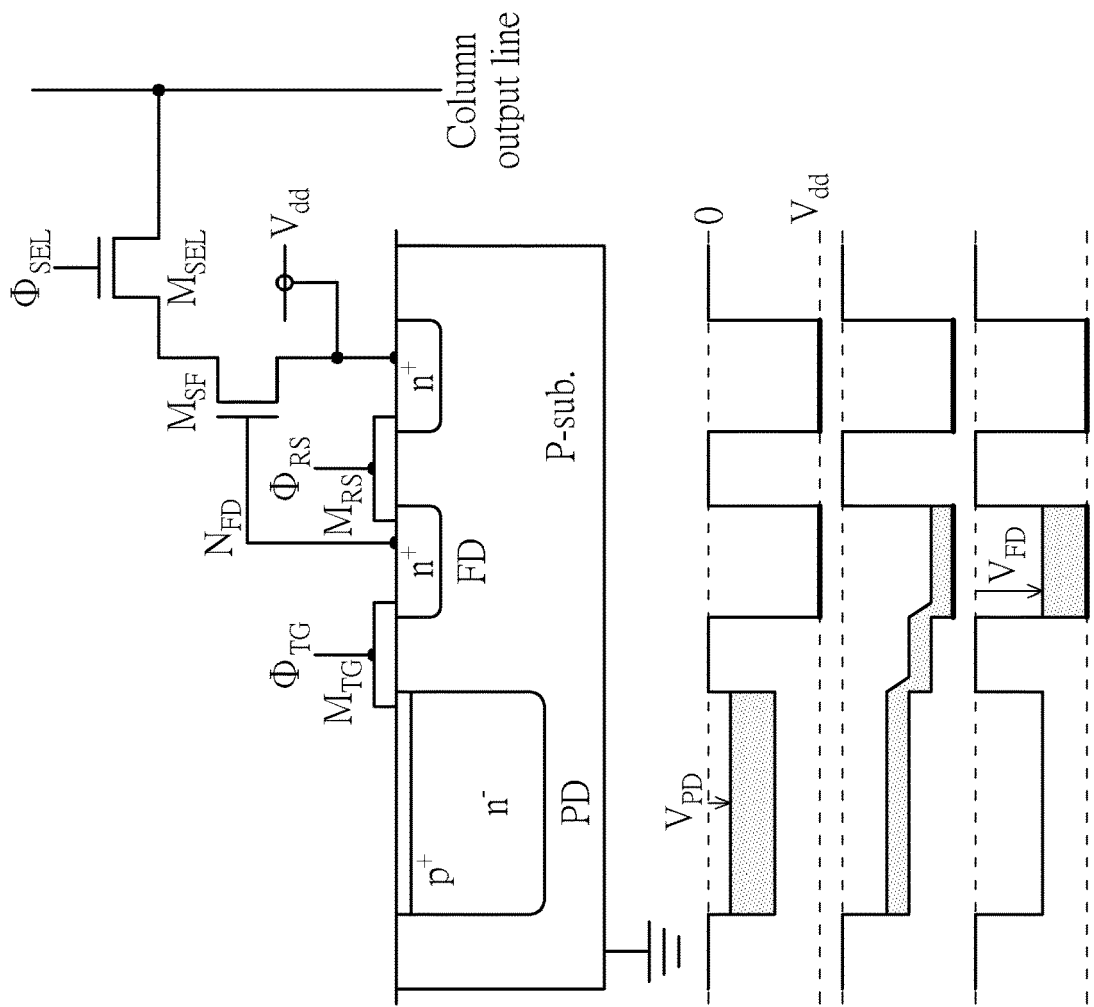
FIG. 3 is a schematic diagram of operations of the control circuit for the sensing pixel.
Figure 3:
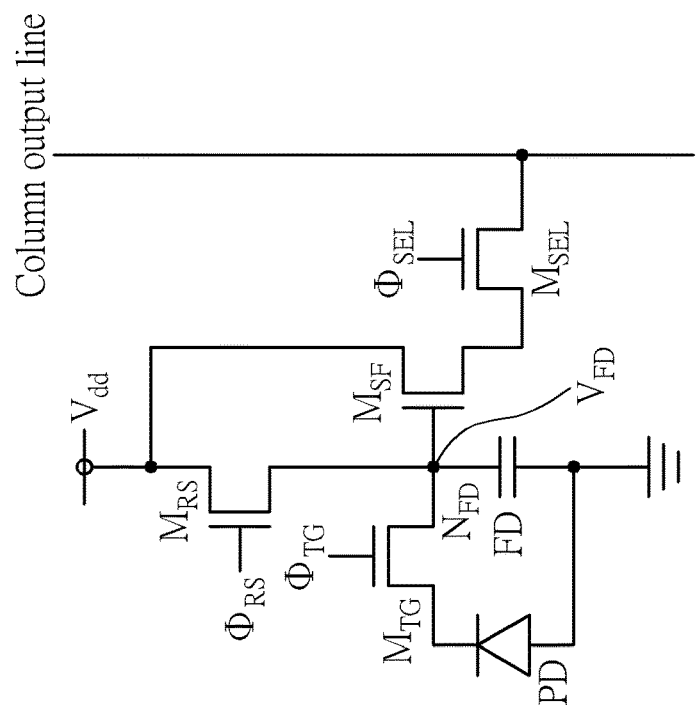

The operations of the control circuit are shown in FIG. 3. The photodiode PD has an n-well, where electrons are generated in the n-well when the photodiode PD is exposed to light. The switch transistor $M_{TG}$ connects the photodiode PD to a sensing node $N_{FD}$ and the storage capacitor FD. Before the sensing node $N_{FD}$ starts to receive electrons, the sensing node $N_{FD}$ is reset to the voltage $V_{dd}$ (via the reset transistor $M_{RS}$). Subsequently, the switch transistor $M_{TG}$ is turned on while other transistors are turned off, allowing the electrons to flow from the n-well of the photodiode PD to the sensing node, to be stored in the storage capacitor FD. After turned on for a time period, the switch transistor $M_{TG}$ is turned off, and at this moment several or all of the electrons have flowed to the sensing node $N_{FD}$, causing the voltage $V_{FD}$ of the sensing node $N_{FD}$ to be reduced. The output signal of this sensing pixel may thereby be determined based on the voltage $V_{FD}$, and forwarded to the corresponding column output line via selection of the select signal $\Phi_{SEL}$ and transistor $M_{SET}$. The electron quantities read out from the photodiode PD are determined by the ambient light sensed by the photodiode PD and also determined by the turned-on time of the switch transistor $M_{TG}$. The higher turned-on time of the switch transistor $M_{TG}$ allows more electrons to be integrated into the sensing node $N_{FD}$, so the turned-on time of the switch transistor $M_{TG}$ is called the integration time (or called the exposure time since the electrons obtained from light exposure are accumulating in the sensing node $N_{FD}$ when the switch transistor $M_{TG}$ is turned on). In this embodiment, the electrons are served as carriers to be read out from the photodiode PD. Note that the carrier types used in the embodiments of the present invention are not limited thereto.

In order to obtain a proper integration time, the electrons in the photodiode PD should be read out and the corresponding electronic signals are outputted to the back-end processor, allowing the processor to determine whether the readout electron quantities are adequate. In other words, whether the integration time is proper is determined after exposure and readout operations are completed. However, due to the characteristics of the sensing circuit, after a readout operation of electrons, the electrons in the photodiode PD may be decreased or even cleared. Therefore, every readout operation results in reduction of the electrons in the photodiode PD, and thus the photodiode PD should restart to sense light to generate electrons and the sensing node should be reset again, and thus subsequent readout operations are feasible.

Figure 4:
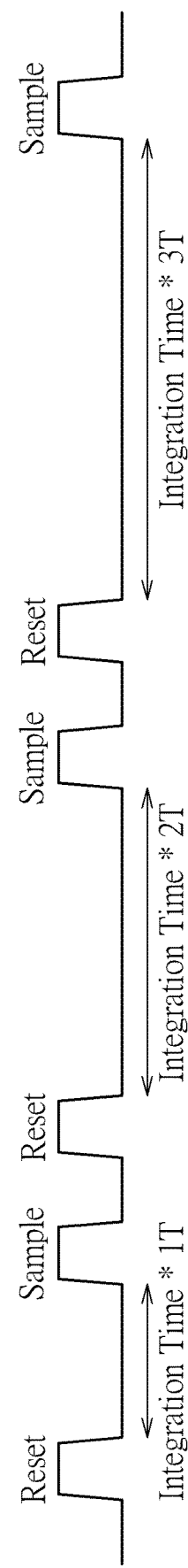
FIG. 4 is a schematic diagram of a series of readout operations of a sensing pixel.

Please refer to FIG. 4 together with FIG. 3, where FIG. 4 illustrates a series of readout operations of a sensing pixel. In each readout operation, the sensing pixel performs reset and the voltage $V_{FD}$ is pulled to $V_{dd}$. Then, the switch transistor $M_{TG}$ is turned on and the integration time starts, and the voltage $V_{FD}$ keeps falling in the integration time period. After the integration time ends, the final value of the voltage $V_{FD}$ is determined, and this value is sampled (via the select transistor $M_{SEL}$) and the related pixel data is read out. In this example, the sensing pixel may start with an integration time 1T. After the pixel data is read out, the back-end processor may know that the value of obtained pixel data is not high enough, which means that the electronic signals accumulated in the sensing node $N_{FD}$ are not enough (or the sensed brightness is not enough) under the integration time 1T. Therefore, the sensing pixel then performs readout operations with the integration time 2T. If the value of obtained pixel data is still not high enough, the sensing pixel then performs readout operations with the integration time 3T. In this example, the value of obtained pixel data under the integration time 3T is high enough, and thus the integration time 3T is determined to be a proper integration time for capturing the fingerprint image. As a whole, the sensor requires total time length 6T to obtain the proper integration time.

In general, the processor may capture an entire image (i.e., the pixel data of every sensing pixel) to determine whether the captured image is bright enough under the configured integration time. Thus, at least 2 or 3 images should be captured so as to obtain a proper integration time. Since each sensing pixel has to undergo a series of readout operations as mentioned above, a lot of time is wasted during the process of integration time determination.

Figure 5:
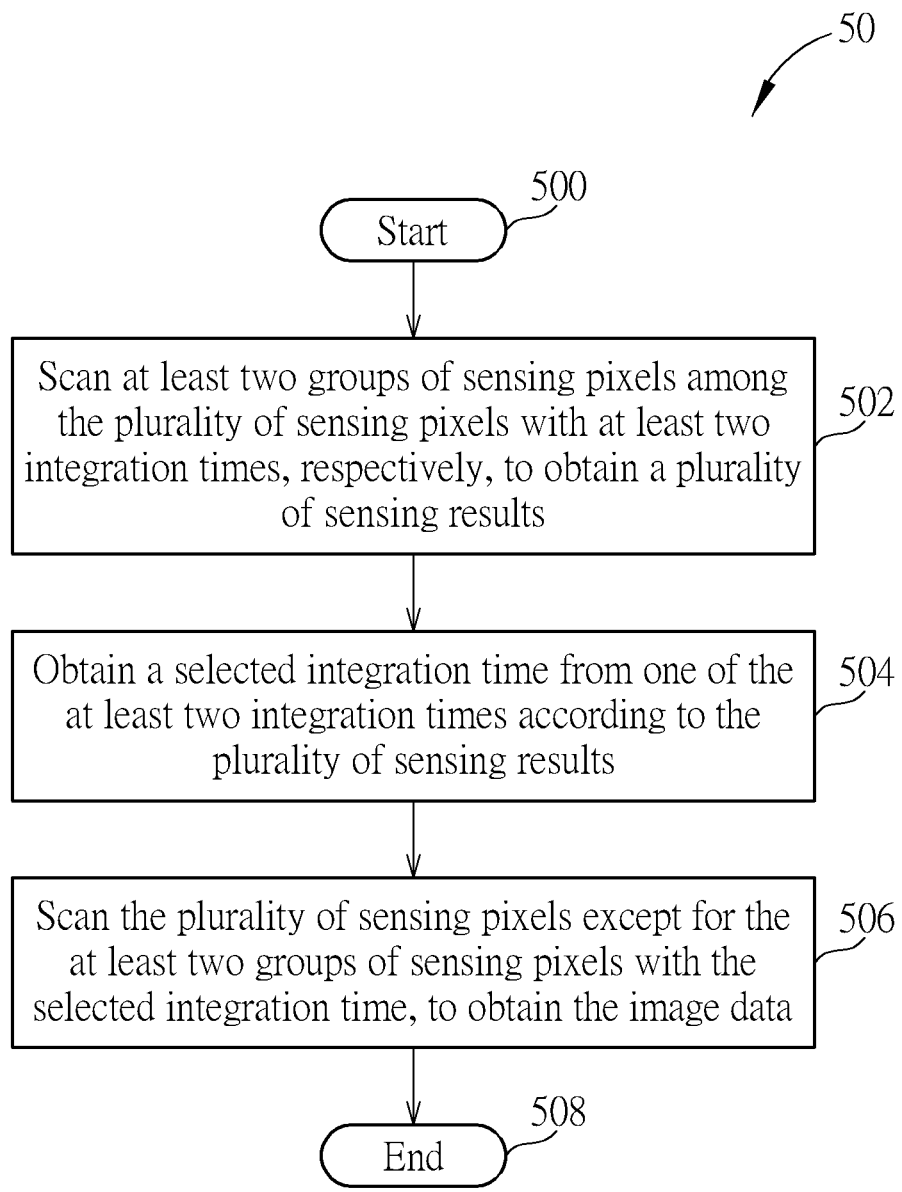
FIG. 5 is a flowchart of a process according to an embodiment of the present invention.

In order to reduce the time consumption for determining the integration time, the present invention provides a method that the readout operations with different integration times are performed in parallel. Please refer to FIG. 5, which is a flowchart of a process 50 according to an embodiment of the present invention. As shown in FIG. 5, the process 50, which may be implemented in a sensor obtaining electronic signals from a sensing pixel array, includes the following steps:

Step 500: Start.

Step 502: Scan at least two groups of sensing pixels among the plurality of sensing pixels with at least two integration times, respectively, to obtain a plurality of sensing results.

Step 504: Obtain a selected integration time from one of the at least two integration times according to the plurality of sensing results.

Step 506: Scan the plurality of sensing pixels except for the at least two groups of sensing pixels with the selected integration time, to obtain the image data.

Step 508: End.

According to the process 50, at least two groups of sensing pixels are scanned with at least two different integration times, respectively. In an embodiment, each group of sensing pixels may be a row of sensing pixels. For example, if two rows of sensing pixels are applied to determine the integration time, a first row of sensing pixels are scanned with the first integration time and a second row of sensing pixels are scanned with the second integration time. The first integration time and the second integration time are predetermined and have different time lengths. The scanning operation means that several or all sensing pixels in the row are sampled, to read out pixel data corresponding to sensed carries (e.g., electrons) in the sensing pixels, where the carriers are sensed by the light sensing elements (e.g., the photodiodes) and then transmitted to the sensing node and storage capacitor in the sensing pixels. The sensing results may be obtained based on the pixel data. Subsequently, one of the at least two integration times is selected as a proper integration time according to the sensing results.

The above scanning operations on the configured groups of sensing pixels are called "pre-scanning". After the proper integration time is determined, the sensor may scan the sensing pixels with the selected integration time, except for the at least two groups of sensing pixels used for obtaining the selected integration time, to obtain the fingerprint image data.

Figure 6:
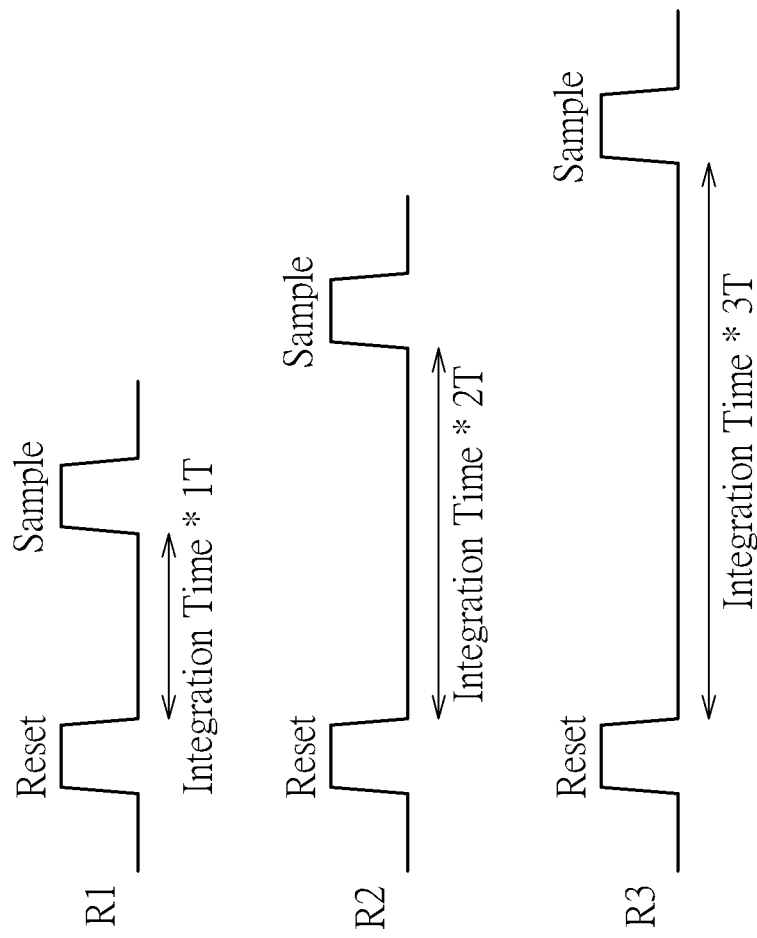
FIG. 6 is a schematic diagram of an implementation of three rows of sensing pixels used for determining the proper integration time.

FIG. 6 illustrates an implementation of three rows R1-R3 of sensing pixels used for determining the proper integration time. As shown in FIG. 6, the three rows R1-R3 of sensing pixels are pre-scanned in parallel. In detail, the sensing nodes in the sensing pixels in the rows R1-R3 are reset simultaneously, and then the integration time starts, where the sensing nodes start to receive electrons from the corresponding photodiodes. The readout operations of the rows R1-R3 of sensing pixels are performed in parallel, and the integration time periods used for different rows of sensing pixels overlap but have different lengths.

More specifically, in the sensing pixels of the row R1, the length of the integration time is determined to be 1T, and thus the sensing nodes receive electrons from the corresponding photodiodes for the configured integration time 1T. In the sensing pixels of the row R2, the length of the integration time is determined to be 2T, and thus the sensing nodes receive electrons from the corresponding photodiodes for the configured integration time 2T. In the sensing pixels of the row R3, the length of the integration time is determined to be 3T, and thus the sensing nodes receive electrons from the corresponding photodiodes for the configured integration time 3T. The three rows R1-R3 of sensing pixels are reset at the same time but sampled at different times. Therefore, in comparison with the conventional method where time length 6T is required to determine the proper integration time (as shown in FIG. 4), similar effects may be achieved within time length 3T by using the method of the present invention (as shown in FIG. 6).

Figure 7:
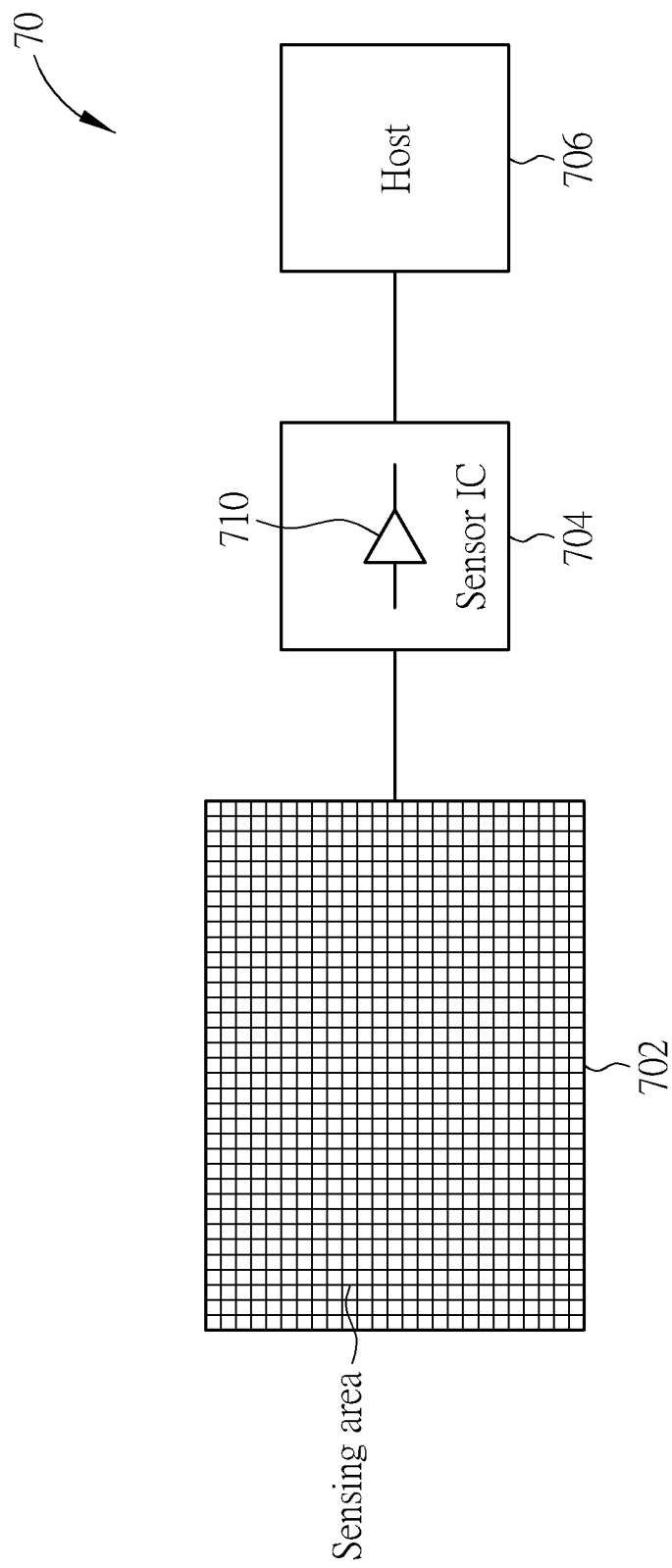
FIG. 7 is a schematic diagram of an image sensing system according to an embodiment of the present invention.

Please refer to FIG. 7, which is a schematic diagram of an image sensing system 70 according to an embodiment of the present invention. The image sensing system 70 may be an optical fingerprint recognition system for sensing a fingerprint image. The image sensing system 70 includes a touch panel 702, a sensor IC 704 and a host 706. The touch panel 702 includes a sensing area, on which an array of sensing pixels are disposed. The sensor IC 704, coupled to the sensing area of the touch panel 702, is configured to perform the abovementioned scanning and readout operations for determining a proper integration time. In an embodiment, the sensing area and the sensing pixels therein may be integrated in the sensor IC 704. The sensor IC 704 may further include an ADC 710, which is capable of converting the electronic signals read out from the sensing pixels into digital pixel data. In another embodiment, multiple ADCs may be included and each ADC is responsible for one or multiple sensing pixels. The host 706, coupled to the sensor IC 704, is configured to select the proper integration time based on the sensing results of the rows R1-R3 of sensing pixels obtained from the sensor IC 704. After the proper integration time is selected, the sensor IC 704 may scan the rest rows of sensing pixels with the selected integration time, and the host 706 obtains the pixel data in these rows and thereby determines whether the fingerprint image is correct. The host 706 may be implemented with any processing device such as a microprocessor, central processing unit (CPU), micro control unit (MCU), and the like.

Please keep referring to FIG. 7 together with FIG. 6. As mentioned above, the sensing nodes in the sensing pixels of the rows R1-R3 are reset simultaneously and then pre-scanned with different integration time lengths. After integration time 1T, scan of the row R1 finishes while other rows R2-R3 are still scanning; hence, the host 706 obtains the sensing result of the row R1 of sensing pixels from the sensor IC 704. According to this sensing result, the host 706 may determine that the integration time 1T is not a proper one, and thus the other rows R2-R3 may be considered. Subsequently, scan of the row R2 finishes, and the host 706 obtains the sensing result of the row R2 of sensing pixels from the sensor IC 704. According to this sensing result, the host 706 may still determine that the integration time 2T for the row R2 is not a proper one. Finally, scan of the row R3 finishes, and the host 706 obtains the sensing result of the row R3 of sensing pixels from the sensor IC 704. According to this sensing result, the host 706 may determine that the integration time 3T is a proper one; hence, the integration time 3T is selected to be used in scan of the entire sensing area to obtain the fingerprint image.

Figure 8:
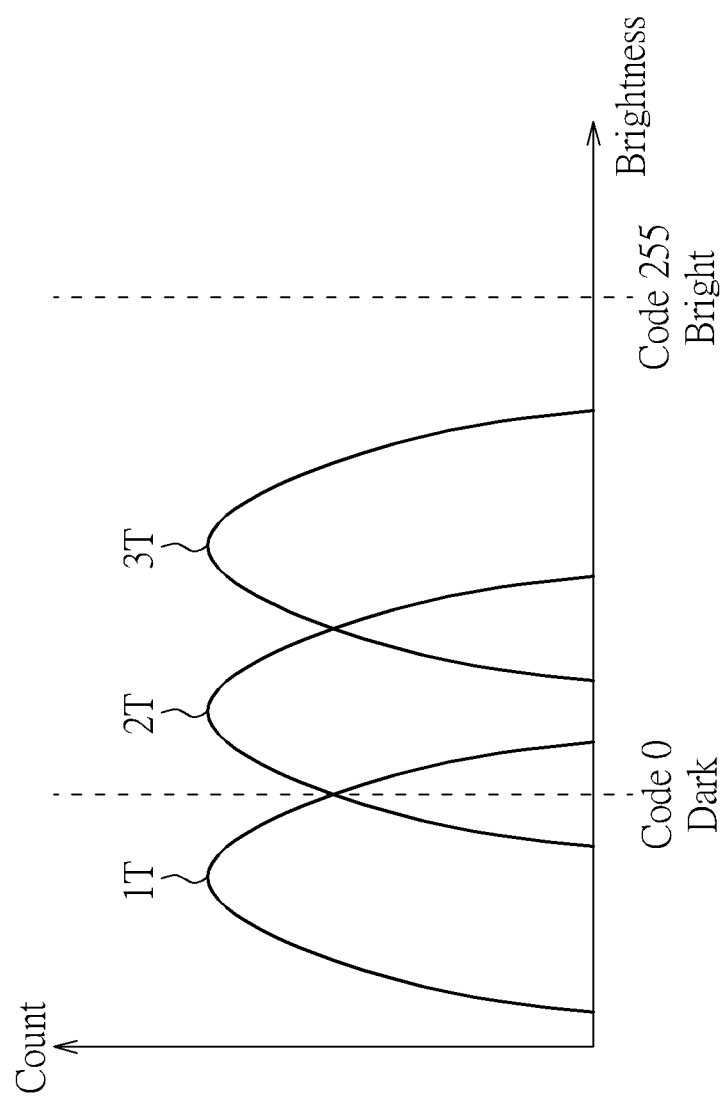
FIG. 8 is a schematic diagram of histogram distributions of sensing signals.

In an embodiment, the sensing results may be histogram distributions of sensing signals in the rows R1-R3 of sensing pixels. Please refer to FIG. 8, which is a schematic diagram of histogram distributions of sensing signals. FIG. 8 shows histogram distributions of sensing signal counts in the rows R1-R3 corresponding to integration times 1T-3T, respectively. With a longer integration time, the sensing signals may become larger, which means that more electrons are received by the sensing node and the image brightness may be higher; hence, distribution of the sensing signals with a longer integration time may correspond to higher brightness. Code 0 and code 255 refer to the smallest code (the darkest) and the largest code (the brightest) of the ADC receiving sensing signals from the sensing pixels, and the range between code 0 and code 255 is the operation range of the ADC (it is an 8-bit ADC in this embodiment). Preferably, the histogram distribution of sensing signals should be entirely or mostly within the operation range of the ADC, i.e., located between code 0 and code 255 of the ADC; hence, the fingerprint image may be correctly converted into digital pixel data by the ADC. Otherwise, the brightness outside the range of the ADC cannot be accurately recognized. Therefore, the host 706 may be configured with an algorithm for judging whether the histogram distribution of sensing signals is mostly within the operation range of the ADC, and thereby determine whether the corresponding integration time is a proper one.

In this embodiment, the histogram distribution of the integration time 1T is mostly outside the range of the ADC, and thus the obtained image under the integration time 1T is too dark. As for the integration time 2T, the histogram distribution has a certain part outside the range of the ADC, and thus the integration time 2T is not a proper one. The histogram distribution of the integration time 3T conforms to the operation range of the ADC, where the center of the histogram distribution is close to the mid code of the ADC and most sensing signals under integration time 3T is within the range between code 0 and code 255; hence, the integration time 3T may be a proper integration time selected for obtaining the fingerprint image.

Please note that the groups of sensing pixels used for determining the integration time may be selected arbitrarily. For example, a row of sensing pixels may be considered as a group configured with a specific integration time. Please refer to FIG. 9, which is a schematic diagram of a sensing area, where three rows R1-R3 of sensing pixels are selected for determining the proper integration time. As mentioned above, due to the characteristics of the sensing circuit, the electrons in the photodiode may be decreased or even cleared after a readout operation. Therefore, the rows R1-R3 in which sensing pixels are sampled and electronic signals are read out cannot be applied to obtain image data of the fingerprint. In such a situation, after the selected integration time is determined, only sensing pixels other than those in the rows R1-R3 are scanned to obtain the final fingerprint image. For example, the sensor IC may start to scan the first row to the last row except for the rows R1-R3 with the selected integration time 3T, and the fingerprint image with a proper brightness will be obtained. Since no image data is obtained from the rows R1-R3, the image data of the rows R1-R3 of sensing pixels may be estimated through interpolation based on the image data of sensing pixels adjacent to the rows R1-R3 after the scanning operations. For example, the image data of the row R1 is obtained through interpolation based on the image data of the rows (R1−1) and (R1+1). The interpolation method may not degrade the image quality because the size of each sensing pixel is extremely small and thus the image data of adjacent sensing pixels may not have evident difference.

Figure 9:
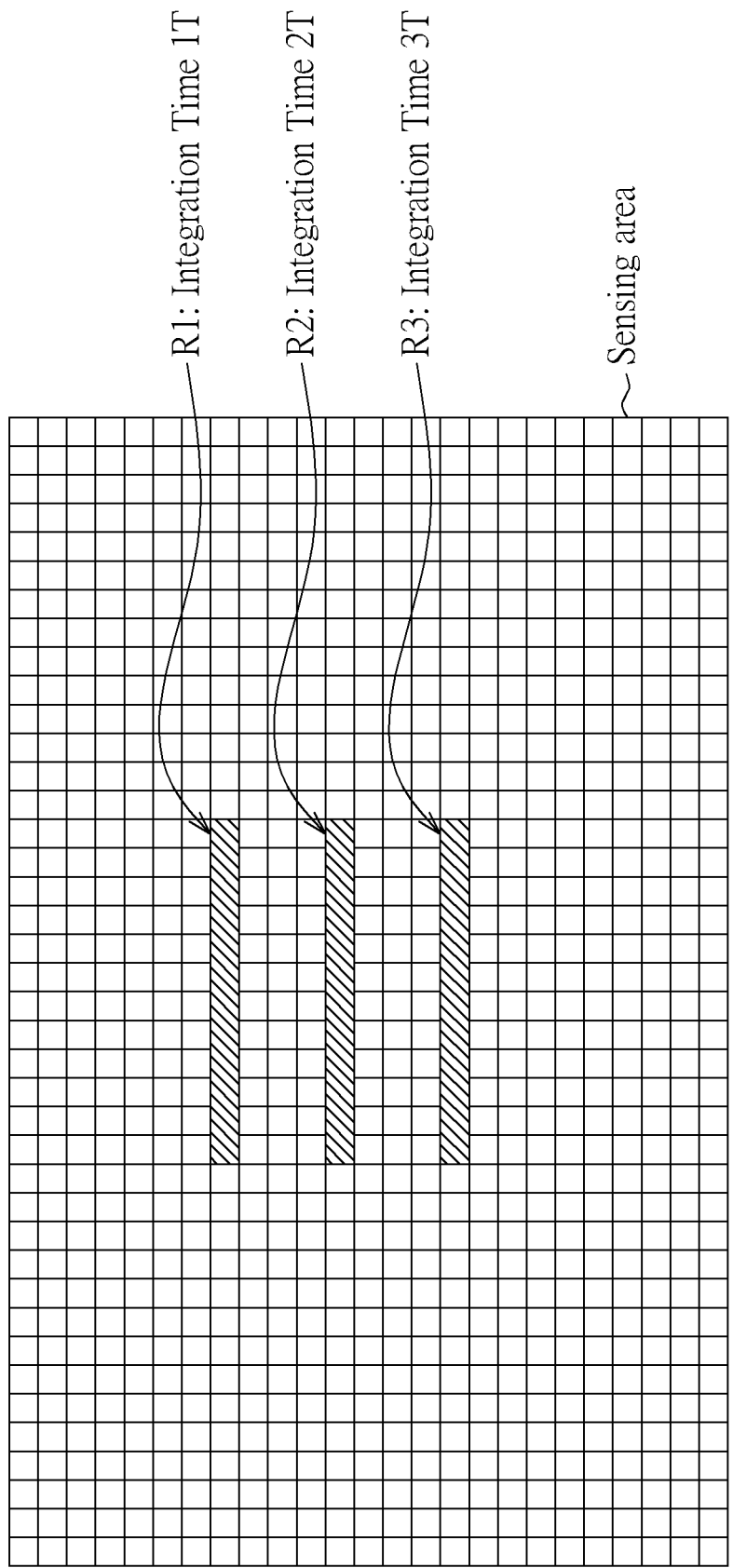
FIG. 9 is a schematic diagram of a sensing area with three rows of sensing pixels selected for determining the proper integration time.

In order to realize the interpolation scheme, the rows of sensing pixels used for determining the integration time should not contain any adjacent rows. As shown in FIG. 9, the rows R1-R3 are all nonadjacent. Otherwise, if any two or more adjacent rows are applied to determine the integration time, the image data of these rows may not be obtained through interpolation accurately.

According to the operations of sensing pixels in the CIS, each column of sensing pixels are connected to a common output line, e.g., the column output line shown in FIG. 2, and pixel data are outputted row by row. In other words, an entire row of sensing pixels are controlled simultaneously as receiving the same horizontal control signals, i.e., each of the control signals $\Phi_{SEL}$, $\Phi_{RS}$ and $\Phi_{TG}$ is outputted to the entire row of sensing pixels. Therefore, the scanning operations for a row of sensing pixels are performed simultaneously. If a sensing pixel is scanned and the pixel data is read out for determining the integration time, the electrons in the photodiodes of all other sensing pixels in the same row are also outputted to the corresponding column output lines. Therefore, it is preferable to select a row of sensing pixels as a group, to generate a histogram distribution based on the sensing signals obtained from partial or entire sensing pixels of the rows; hence, other non-selected rows may not be sacrificed. For example, in the embodiment shown in FIG. 9, partial sensing pixels near the center of the sensing area in the rows R1-R3 are selected to generate the sensing results for determining the integration time. Those skilled in the art should understand that the groups of sensing pixels used for determining the integration time may be selected by other methods, which are not limited herein.

Please note that the present invention aims at providing a method of obtaining image data by pre-scanning several groups of sensing pixels to obtain a proper integration time, so as to increase the speed of determining the integration time. Those skilled in the art may make modifications and alternations accordingly. For example, the circuit structure of the sensing pixels shown in FIG. 2 is one of various implementations of the sensing pixels. Other circuit structures are also applicable as long as the carriers of photodiode may be forwarded to a sensing node and read out. In another embodiment, the selected integration time may not be 3T, where 2T, 4T (might include another group of sensing pixels pre-scanned with integration time 4T), or other time length may also be feasible. In addition, in the above embodiment, the histogram distribution of sensing signals is considered as a sensing result for selecting the proper integration time. In another embodiment, the sensing result may be the contrast of sensing signals or pixel data in the configured group or row. After the sensing signals or pixel data of a group of sensing pixels are obtained, the host may find brighter data and darker data respectively corresponding to peaks and troughs of the fingerprint. The contrast, as represented by the difference between the brighter data and the darker data, may be applied to select the proper integration time.

Figure 10:
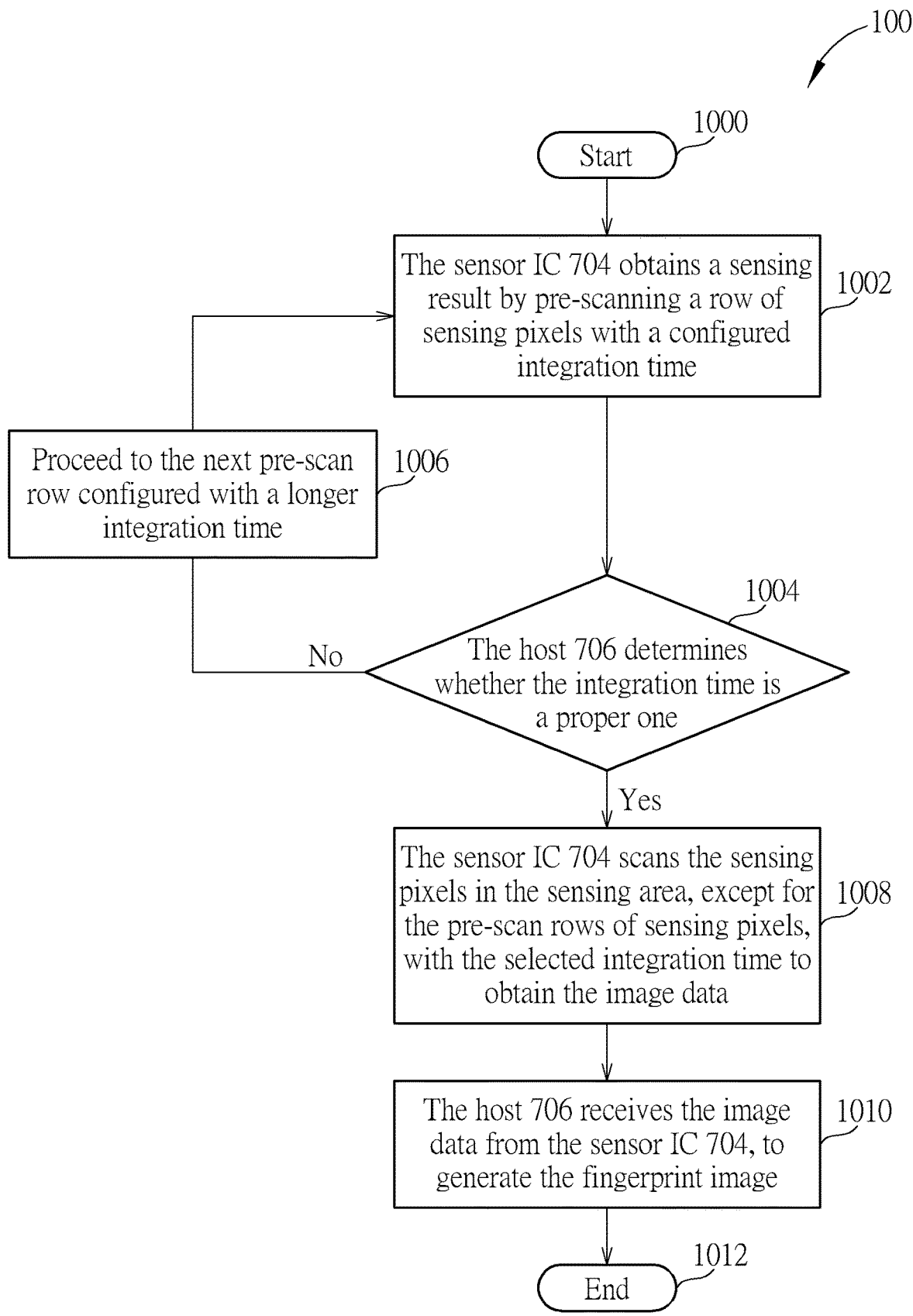
FIG. 10 is a flowchart of a process according to an embodiment of the present invention.

The abovementioned operations of pre-scanning the groups of sensing pixels to determine the proper integration time and then scanning all sensing pixels except for the groups may be summarized into a process 100, as shown in FIG. 10. The process 100, which may be implemented in the image sensing system 70, includes the following steps:

Step 1000: Start.

Step 1002: The sensor IC 704 obtains a sensing result by pre-scanning a row of sensing pixels with a configured integration time.

Step 1004: The host 706 determines whether the integration time is a proper one. If yes, go to Step 1008; otherwise, go to Step 1006.

Step 1006: Proceed to the next pre-scan row configured with a longer integration time.

Step 1008: The sensor IC 704 scans the sensing pixels in the sensing area, except for the pre-scan rows of sensing pixels, with the selected integration time to obtain the image data.

Step 1010: The host 706 receives the image data from the sensor IC 704, to generate the fingerprint image.

Step 1012: End.

The detailed operations and alternations of the process 100 are illustrated in the above paragraphs, and will not be narrated herein.

To sum up, the present invention provides a method of obtaining image data and a related image sensing system such as fingerprint recognition system. In the sensing area of the image sensing system, several groups of sensing pixels are configured with different integration times and pre-scanned with the configured integration times. The proper integration time may be determined from the sensing results of the pre-scanning operations. After the proper integration time is determined, the sensor may scan the sensing pixels with the selected integration time, except for the groups of sensing pixels used for pre-scanning, to obtain the fingerprint data. The pre-scanning operations of the groups are performed in parallel, so as to increase the speed for determining the integration time.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of obtaining image data for an image sensing system, the image sensing system comprising a sensing area having a plurality of sensing pixels, the method comprising:
scanning at least two groups of sensing pixels among the plurality of sensing pixels with at least two integration times, respectively, to obtain a plurality of sensing results;
selecting an integration time from the at least two integration times according to the plurality of sensing results; and
scanning the plurality of sensing pixels except for the at least two groups of sensing pixels with the selected integration time, to obtain the image data.

2. The method of claim 1, wherein each of the plurality of sensing pixels comprises a light sensing element, and the step of scanning the at least two groups of sensing pixels among the plurality of sensing pixels with the at least two integration times respectively comprises:
sampling a sensing pixel among the at least two groups of sensing pixels, to read out an electronic signal corresponding to carriers sensed by the light sensing element in the sensing pixel.

3. The method of claim 1, wherein each of the plurality of sensing pixels comprises a light sensing element, and the step of scanning the at least two groups of sensing pixels among the plurality of sensing pixels with the at least two integration times respectively comprises:
   resetting a sensing node coupled to the light sensing element in a sensing pixel among the at least two groups of sensing pixels; and
   receiving, by the sensing node, carriers from the light sensing element for one of the at least two integration times.

4. The method of claim 3, wherein the sensing node in each sensing pixel among the at least two groups of sensing pixels is reset simultaneously.

5. The method of claim 3, wherein the step of scanning the at least two groups of sensing pixels among the plurality of sensing pixels with the at least two integration times respectively further comprises:
   receiving, by the sensing node in a first group of sensing pixels among the at least two groups of sensing pixels, carriers from the corresponding light sensing element for a first integration time among the at least two integration times; and
   receiving, by the sensing node in a second group of sensing pixels among the at least two groups of sensing pixels, carriers from the corresponding light sensing element for a second integration time among the at least two integration times;
   wherein the first integration time and the second integration time overlap.

6. The method of claim 1, wherein the at least two groups of sensing pixels are nonadjacent rows of sensing pixels.

7. The method of claim 1, wherein the plurality of sensing results comprise a histogram distribution of sensing signals in a group of sensing pixels among the at least two groups of sensing pixels.

8. The method of claim 7, wherein a first integration time is selected as the selected integration time when the histogram distribution of sensing signals obtained with the first integration time conforms to an operation range of an analog to digital converter (ADC) configured to output pixel data based on the sensing signals received from the plurality of sensing pixels.

9. The method of claim 1, wherein the plurality of sensing results comprise a contrast of sensing signals in a group of sensing pixels among the at least two groups of sensing pixels.

10. The method of claim 1, wherein the image data of the at least two groups of sensing pixels are obtained through interpolation based on the image data of sensing pixels adjacent to the at least two groups of sensing pixels after the step of scanning the plurality of sensing pixels except for the at least two groups of sensing pixels with the selected integration time.

11. An image sensing system, comprising:
   a sensing area, comprising a plurality of sensing pixels;
   a sensor, coupled to the sensing area, configured to obtain image data by performing the following steps:
     scanning at least two groups of sensing pixels among the plurality of sensing pixels with at least two integration times, respectively, to obtain a plurality of sensing results;
     selecting an integration time from the at least two integration times according to the plurality of sensing results; and
     scanning the plurality of sensing pixels except for the at least two groups of sensing pixels with the selected integration time, to obtain the image data.

12. The image sensing system of claim 11, wherein each of the plurality of sensing pixels comprises a light sensing element, and the sensor performs the following step to scan the at least two groups of sensing pixels among the plurality of sensing pixels with the at least two integration times respectively:
   sampling a sensing pixel among the at least two groups of sensing pixels, to read out an electronic signal corresponding to carriers sensed by the light sensing element in the sensing pixel.

13. The image sensing system of claim 11, wherein each of the plurality of sensing pixels comprises a light sensing element, and the sensor performs the following steps to scan the at least two groups of sensing pixels among the plurality of sensing pixels with the at least two integration times respectively:
   resetting a sensing node coupled to the light sensing element in a sensing pixel among the at least two groups of sensing pixels; and
   controlling the sensing node to receive carriers from the light sensing element for one of the at least two integration times.

14. The image sensing system of claim 13, wherein the sensing node in each sensing pixel among the at least two groups of sensing pixels is reset simultaneously.

15. The image sensing system of claim 13, wherein the sensor further performs the following steps to scan the at least two groups of sensing pixels among the plurality of sensing pixels with the at least two integration times respectively:
   controlling the sensing node in a first group of sensing pixels among the at least two groups of sensing pixels to receive carriers from the corresponding light sensing element for a first integration time among the at least two integration times; and
   controlling the sensing node in a second group of sensing pixels among the at least two groups of sensing pixels to receive carriers from the corresponding light sensing element for a second integration time among the at least two integration times;
   wherein the first integration time and the second integration time overlap.

16. The image sensing system of claim 11, wherein the at least two groups of sensing pixels are nonadjacent rows of sensing pixels.

17. The image sensing system of claim 11, wherein the plurality of sensing results comprise a histogram distribution of sensing signals in a group of sensing pixels among the at least two groups of sensing pixels.

18. The image sensing system of claim 17, further comprising:
   an analog to digital converter (ADC), configured to output pixel data based on the sensing signals received from the plurality of sensing pixels; and
   a host, coupled to the sensor, configured to select a first integration time as the selected integration time when the histogram distribution of sensing signals obtained with the first integration time conforms to an operation range of the ADC.

19. The image sensing system of claim 11, wherein the plurality of sensing results comprise a contrast of sensing signals in a group of sensing pixels among the at least two groups of sensing pixels.

20. The image sensing system of claim 11, wherein the image data of the at least two groups of sensing pixels are obtained through interpolation based on the image data of sensing pixels adjacent to the at least two groups of sensing pixels after the sensor scans the plurality of sensing pixels except for the at least two groups of sensing pixels with the selected integration time.

21. A sensing circuit coupled to a sensing area having a plurality of sensing pixels, the sensing circuit being configured to obtain image data by performing the following steps:
scanning at least two groups of sensing pixels among the plurality of sensing pixels with at least two integration times, respectively, to obtain a plurality of sensing results;
selecting an integration time from the at least two integration times according to the plurality of sensing results; and
scanning the plurality of sensing pixels except for the at least two groups of sensing pixels with the selected integration time, to obtain the image data.

22. The sensing circuit of claim 21, wherein each of the plurality of sensing pixels comprises a light sensing element, and the sensing circuit is configured to perform the following step to scan the at least two groups of sensing pixels among the plurality of sensing pixels with the at least two integration times respectively:
sampling a sensing pixel among the at least two groups of sensing pixels, to read out an electronic signal corresponding to carriers sensed by the light sensing element in the sensing pixel.

23. The sensing circuit of claim 21, wherein each of the plurality of sensing pixels comprises a light sensing element, and the sensing circuit is configured to perform the following steps to scan the at least two groups of sensing pixels among the plurality of sensing pixels with the at least two integration times respectively:
resetting a sensing node coupled to the light sensing element in a sensing pixel among the at least two groups of sensing pixels; and
controlling the sensing node to receive carriers from the light sensing element for one of the at least two integration times.

24. The sensing circuit of claim 23, wherein the sensing node in each sensing pixel among the at least two groups of sensing pixels is reset simultaneously.

25. The sensing circuit of claim 23, wherein the sensing circuit is further configured to perform the following steps to scan the at least two groups of sensing pixels among the plurality of sensing pixels with the at least two integration times respectively:
controlling the sensing node in a first group of sensing pixels among the at least two groups of sensing pixels to receive carriers from the corresponding light sensing element for a first integration time among the at least two integration times; and
controlling the sensing node in a second group of sensing pixels among the at least two groups of sensing pixels to receive carriers from the corresponding light sensing element for a second integration time among the at least two integration times;
wherein the first integration time and the second integration time overlap.

26. The sensing circuit of claim 21, wherein the at least two groups of sensing pixels are nonadjacent rows of sensing pixels.

27. The sensing circuit of claim 21, wherein the plurality of sensing results comprise a histogram distribution of sensing signals in a group of sensing pixels among the at least two groups of sensing pixels.

28. The sensing circuit of claim 27, wherein the sensing circuit is further coupled to:
an analog to digital converter (ADC), configured to output pixel data based on the sensing signals received from the plurality of sensing pixels; and
a host, configured to select a first integration time as the selected integration time when the histogram distribution of sensing signals obtained with the first integration time conforms to an operation range of the ADC.

29. The sensing circuit of claim 21, wherein the plurality of sensing results comprise a contrast of sensing signals in a group of sensing pixels among the at least two groups of sensing pixels.

30. The sensing circuit of claim 21, wherein the image data of the at least two groups of sensing pixels are obtained through interpolation based on the image data of sensing pixels adjacent to the at least two groups of sensing pixels after the sensing circuit scans the plurality of sensing pixels except for the at least two groups of sensing pixels with the selected integration time.

* * * * *